(12) United States Patent
Liao

(10) Patent No.: US 11,595,059 B2
(45) Date of Patent: Feb. 28, 2023

(54) METHOD AND DEVICE FOR COMPRESSING DATA, AND METHOD AND DEVICE FOR DECOMPRESSING DATA

(71) Applicant: HON HAI PRECISION INDUSTRY CO., LTD., New Taipei (TW)

(72) Inventor: Jen-Hao Liao, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 0 days.

(21) Appl. No.: 17/405,519

(22) Filed: Aug. 18, 2021

(65) Prior Publication Data

US 2022/0060197 A1 Feb. 24, 2022

(30) Foreign Application Priority Data

Aug. 18, 2020 (CN) .......................... 202010833377.0

(51) Int. Cl.
*H03M 13/09* (2006.01)
*H04L 1/00* (2006.01)

(52) U.S. Cl.
CPC .......... *H03M 13/09* (2013.01); *H04L 1/0041* (2013.01); *H04L 1/0045* (2013.01); *H04L 1/0061* (2013.01)

(58) Field of Classification Search
CPC .... H03M 13/05; H03M 13/09; H03M 13/096; H03M 13/156; H04L 1/0041; H04L 1/0045; H04L 1/0061
See application file for complete search history.

(56) References Cited

U.S. PATENT DOCUMENTS

| | | | |
|---|---|---|---|
| 8,332,722 B1* | 12/2012 | Vera Rojas | H03K 19/17764 714/752 |
| 10,749,545 B1* | 8/2020 | Breslow | G06F 16/902 |
| 2004/0025086 A1* | 2/2004 | Gorday | G01R 31/317 714/37 |
| 2014/0281155 A1 | 9/2014 | Cohen | |
| 2018/0121362 A1 | 5/2018 | Garg | |
| 2022/0046114 A1* | 2/2022 | Entelis | H04L 69/08 |

FOREIGN PATENT DOCUMENTS

| | | |
|---|---|---|
| TW | 201506769 A | 2/2015 |
| WO | 2011025967 A2 | 3/2011 |

OTHER PUBLICATIONS

Mitra et al., Reconfigurable concurrent VLSI (FPGA) design architecture of CRC-32 for high-speed data communication, IEEE International Symposium on Nanoelectronic and information systems, pp. 112-117. (Year: 2015).*

* cited by examiner

*Primary Examiner* — Shelly A Chase
(74) *Attorney, Agent, or Firm* — ScienBiziP, P.C.

(57) ABSTRACT

A method for compressing pre-compressed data used in a reconfigurable processor, where the pre-compressed data includes a number of data blocks, obtains a current data block, calculates a current checking code of the current data block, and compares the current checking code with an immediately-previous checking code. A tag of the current data block is marked as a first tag if the current checking code and the immediately-previous checking code are different, and is marked as a second tag if the current checking code and the immediately-previous checking code are the same. Only data blocks whose tags are the first tags are saved. A related device for compressing data, and a method and a device for decompressing data are also provided.

15 Claims, 6 Drawing Sheets

|   |     |     |      |     |
|---|-----|-----|------|-----|
| A | 123 | 5a5a| 4400 | 456 |
| B | 123 | 5a5a| 4400 | 456 |
| C | 789 | 3   | 22   | dd3 |
| D | 789 | 3   | 22   | dd3 |
| E | 789 | 3   | 22   | dd3 |

FIG. 2A

| | |
|---|---|
| CRC1 | a |
| CRC1 | b |
| CRC2 | c |
| CRC2 | d |
| CRC2 | e |

FIG. 2B

| | |
|---|---|
| 100 | 1 |
| 200 | 0 |
| 300 | 1 |
| 400 | 0 |
| 500 | 0 |

FIG. 3A

|   |     |      |      |     |
|---|-----|------|------|-----|
| A | 123 | 5a5a | 4400 | 456 |
| C | 789 | 3    | 22   | dd3 |

FIG. 3B

| 123 | 5a5a | 4400 | 456 |
|-----|------|------|-----|
| 123 | 5a5a | 4400 | 456 |
| 789 | 3    | 22   | dd3 |
| 789 | 3    | 22   | dd3 |
| 789 | 3    | 22   | dd3 |

FIG. 5

METHOD AND DEVICE FOR COMPRESSING DATA, AND METHOD AND DEVICE FOR DECOMPRESSING DATA

FIELD

The subject matter herein generally relates to data processing and particularly, to a method and a device for compressing data, and a method and a device for decompressing data.

BACKGROUND

Uncompressed data in a reconfigurable processor is can be huge in amount, requiring a higher rate of throughput during data transmission. On the other hand, the reconfigurable processor is hardware with an array of function units capable of rapidly processing a large-scale amount of data. A code is generally stored in a configuration memory. However, because the amount of data in function units in the reconfigurable processor is large, a code length is also very long, causing the configuration memory to occupy a larger part or functional area on the reconfigurable processor. A method for compressing data with a suitable method for decompressing data are needed to avoid the higher throughput during transmission of such large amounts of data and avoid the large parts or functions of the reconfigurable processor being occupied by such long code lengths.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

FIG. 2A illustrates current data blocks obtained at different times.

FIG. 2B illustrates the current checking codes of different current data blocks.

FIG. 3A illustrates tags indicating different current data blocks of FIG. 2A.

FIG. 3B illustrates saved data blocks whose tag is the first tag.

FIG. 5 illustrates data blocks decompressed from saved data blocks of FIG. 3B.

DETAILED DESCRIPTION

Figure 1:
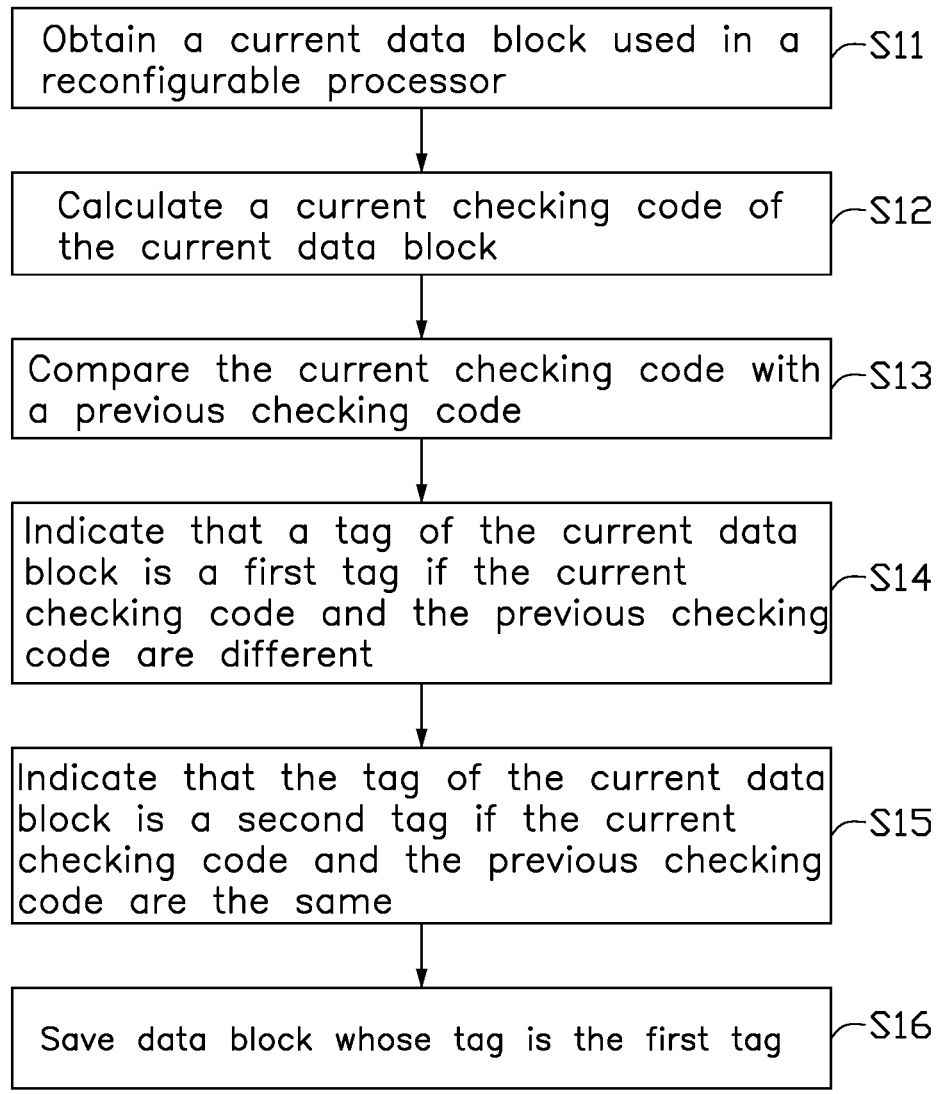
FIG. 1 illustrates a flowchart of a first embodiment of a method for compressing data.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, referencing the accompanying drawings, is illustrated by way of examples and not by way of limitation. It should be noted that references to "an" or "one" embodiment in this disclosure are not necessarily to the same embodiment, and such references mean "at least one."

FIG. 1 illustrates a flowchart of a first embodiment of a method for compressing data. The data is pre-compressed data used in a reconfigurable processor. The pre-compressed data includes a number of data blocks. The method for compressing data begins at block S11.

At block S11, obtaining a current data block used in the reconfigurable processor.

In the embodiment, the method for compressing data includes obtaining the current data block used in the reconfigurable processor when receiving pre-compressed data. The pre-compressed data can be obtained by the reconfigurable processor from an external component and can be obtained by a component of the reconfigurable processor from another component of the reconfigurable processor. The pre-compressed data includes configuration data and network parameters. A current data block used in the reconfigurable processor when receiving pre-compressed data can be:

For example, a current data block is data obtained from a first data to a tenth data of the pre-compressed data when receiving a continuous data of ten segments of the pre-compressed data. A next current data block is data obtained from an eleventh data to a twentieth data of the pre-compressed data when receiving a continuous data of another ten segments of the pre-compressed data. The current data block having a starting segment of the continuous data obtained at a first time can be different or the same as the current data block having the continuous data from the eleventh data to the twentieth data of the pre-compressed data obtained at a second time. For example, as shown in FIG. 2A, FIG. 2A, current data blocks can be obtained at different times. As in FIG. 2A, a current data block A is a first obtained data block, a current data block B is a second obtained data block, a current data block C is a third obtained data block, a current data block D is a fourth obtained data block, and a current data block E is a fifth obtained data block. The current data block B is the same as the current data block A, the current data block C is different from the current data blocks A and B, current data block D is the same as the current data block C, and the current data block E is the same as the current data blocks C and D.

In the embodiment, the data block is obtained at a predefined data size by the reconfigurable processor. In the embodiment, the method further includes obtaining a final data block of the pre-compressed data as the current data block even if a data size of the final data block of the pre-compressed data is less in size than the predefined data size.

At block S12, calculating a current checking code of the current data block.

In the embodiment, the method for compressing data includes calculating the current checking code of the current data block via a cyclic redundancy check circuit. If two current data blocks are the same, the current checking codes of the two current data blocks are also the same. If two current data blocks are different, the current checking codes of the two current data blocks are also different. For example, FIG. 2B shows the current checking codes of the different current data blocks of FIG. 2A. In FIG. 2B, a current checking code a of current data block A is CRC1, a current checking code b of the current data block B is CRC 1, a current checking code c of current data block C is CRC2, a current checking code d of current data block D is CRC2, and a current checking code e of current data block E is CRC2.

In the embodiment, the current data block used in the reconfigurable processor is obtained when receiving the pre-compressed data, thus the current checking code is synchronously generated after the pre-compressed data is received completely. The delay time is accordingly reduced, and data consistency is accordingly kept during data processing.

At block S13, comparing the current checking code with a previous checking code.

In the embodiment, the method for compressing data compares and determines whether the current checking code and the previous checking code are identical or substantially the same. "Substantially the same" can be determined by preset regulations. For example, a mere difference in typefaces and a difference in font sizes do not prevent the code from being determined as "substantially the same."

At block S14, indicating that a tag of the current data block is a first tag if the current checking code and the previous checking code are different.

The current checking code and the previous checking code being different represents that the current data block (with the current checking code) and the immediately previous data block (with the previous checking code) are different. The difference can include completely different and substantially different. The method for compressing data further includes presetting current checking code and the previous checking code as being different if the current checking code is a checking code of the first current data block.

At block S15, indicating that the tag of the current data block is a second tag if the current checking code and the previous checking code are the same.

The current checking code being the same as the previous checking code represents that the current data block is identical to the immediately-previous data block. Being the same includes substantially the same in addition to being identical.

For example, the current checking code of the current data block obtained at a sixtieth time and the previous checking code of the previous data block obtained at a fifty-ninth time are the same, thus the tag of the current data block (the sixtieth data block) is the second tag. The current checking code of the current data block obtained at a sixty-first time and the previous checking code of the previous data block obtained at the sixtieth time are the same, thus the tag of the current data block obtained at the sixty-first time is the second tag.

In the embodiment, the method for compressing data includes indicating the tag of the current data block at a sequence of time of obtaining the current data block. The indicated tags of the current data blocks include the first tag and the second tag of the current data block. Thus, the tags of the obtained current data blocks are indicated at the sequence of time of obtaining the current data block. In the embodiment, the first tag is one and the second tag is zero.

For example, as shown in FIG. 3A, tags indicating different current data blocks of FIG. 2A are illustrated, thus a tag 100 of the current data block A is one, a tag 200 of the current data block B is zero, a tag 300 of the current data block C is one, a tag 400 of the current data block D is zero, and a tag 500 of the current data block E is zero. In the embodiment, the one tag of the current data block A is stored before the zero tag of the current data block B, the zero tag of the current data block B is stored before the one tag of the current data block C, the one tag of the current data block C is stored before the zero tag of the current data block D, and the zero tag of the current data block D is stored before the zero tag of the current data block E. In other embodiments, the first tag can be zero and the second tag can be one.

At block S16, saving data block whose tag is the first tag.

The data block whose tag is the first tag is different from the immediately previous data block. The method for compressing data includes saving the data block whose tag is the first tag at the sequence of time of obtaining the data block. Thus, the data blocks whose tag is the first tag are saved at the sequence of time of obtaining the current data block. For example, as shown in FIG. 3B, saved data blocks whose tag is the first tag, the data block A whose tag is the first tag is stored before the data block C whose tag is the first tag.

In the embodiment, the method for compressing data further includes omitting the data block whose tag is the second tag.

The data block whose tag is the second tag is the same as the immediately previous data block. The data blocks whose tag are the second tags are not saved.

The first embodiment of the method obtains the current data block used in the reconfigurable processor, calculates the current checking code of the current data block, compares the current checking code with the previous checking code, and indicates the first tag or second tag as the case may be. Only the data blocks whose tags are the first tag are saved. Thus, the method avoids the higher throughput during data transmission caused by the huge amounts of data and avoids over-occupation by the configuration memory on the reconfigurable processor caused by long code lengths. On the other hand, the method compresses the data without distortion and without a statistical model and compresses the data only with the cyclic redundancy check, thus less hardware (or less hardware cost) is required. The method for compressing data can be not only used by itself, but also simultaneously combined with other known methods for data compression, for example, a statistical scheme and a dictionary scheme, thus a speed of compressing can be improved.

Figure 4:
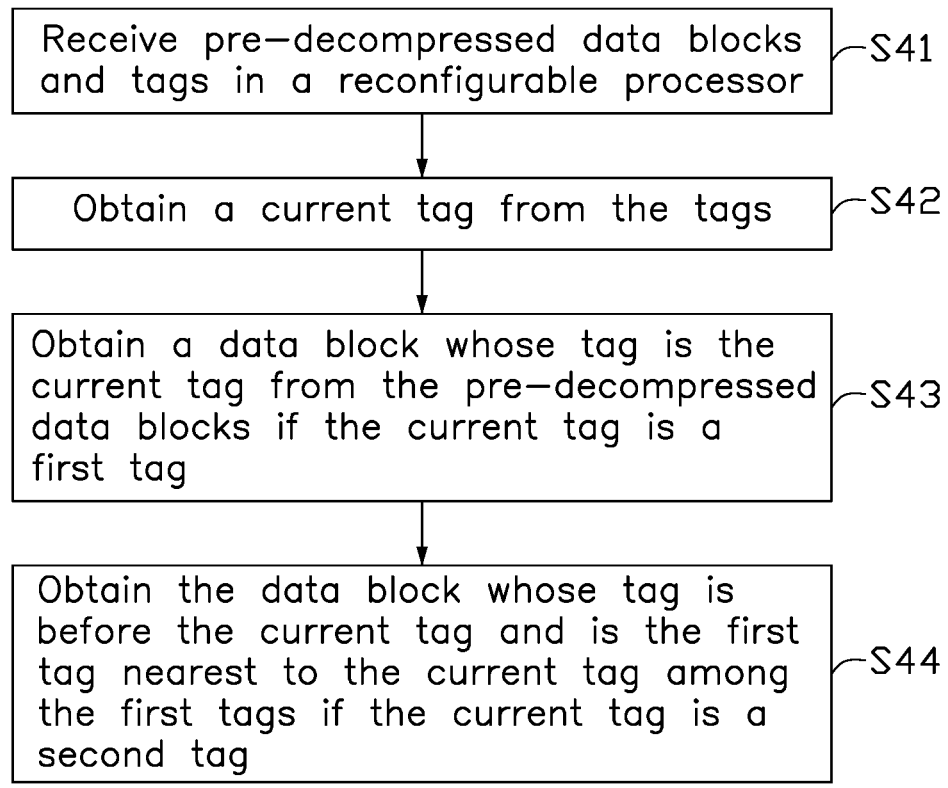
FIG. 4 illustrates a flowchart of a second embodiment of a method for decompressing data.

FIG. 4 illustrates a flowchart of a second embodiment of a method for decompressing data. The data can be pre-decompressed data used in the reconfigurable processor. The pre-decompressed data comprising a plurality of pre-decompressed data blocks. The method for decompressing data begins at block S41.

At block S41, receiving the pre-decompressed data blocks and a number of tags in the reconfigurable processor.

In the embodiment, the pre-decompressed data blocks can be received by an external component from the reconfigurable processor and can be received by a component of the reconfigurable processor from another component of the reconfigurable processor. The pre-decompressed data blocks and the tags in the reconfigurable processor can be, for example, the data blocks saved in the reconfigurable processor as shown in FIG. 3B and the tags as shown in FIG. 3A.

At block S42, obtaining a current tag from the tags.

The method for decompressing data includes obtaining the current tag from the tags one-by-one at a sequence of time of indicating the tag. For example, as shown in FIG. 3A, the tags are indicated in a sequence of a tag 100, a tag 200, a tag 300, a tag 400, and a tag 500. The current tag from the tags obtained one-by-one at a sequence of time of indicating the tag can be, for example, a current tag being the tag 100 whose value is one obtained at a first second, and a next current tag being the tag 200 whose value is zero obtained at an eleventh second.

At block S43, obtaining a data block whose tag is the current tag from the pre-decompressed data blocks if the current tag is a first tag.

The current tag whose value is one represents that the current data block whose tag is the current tag and the immediately previous data block are different. At this moment, the compressed data blocks include the data block whose tag is the current tag. For example, as shown in FIG. 5, FIG. 5 illustrates data blocks decompressed from saved data blocks of FIG. 3B, if the first tag 100 as shown in FIG. 3A is the current tag, at this moment, the data block A whose tag is the first tag 100 is obtained from the compressed data blocks as shown in FIG. 3B. The sizes of the data blocks are substantially the same. In detail, the sizes of the data blocks excluding the final data block are the same, and each is different or the same as a size of the final data block.

At block S44, obtaining the data block whose tag is before the current tag and is the first tag nearest to the current tag among the first tags if the current tag is a second tag.

The current tag whose value is zero represents that the current data block whose tag is the current tag and the immediately previous data block are the same. In the embodiment, the current data block can be not only the same as the immediately previous data block, but also the same as a previous second data block, or a previous Nth data block. The N is any integers more than two. The tag is before the current tag and is the first tag nearest to the current tag among the first tags can be, for example, as shown in FIG. 5, the current tag is the tag 500, at this moment, the tag being before the tag 500 and the first tag nearest to the tag 500 among the first tags is 300. At this moment, a data block C whose tag is the tag 300 is obtained from the saved data blocks as shown in FIG. 3B. The tag 300 is before the tag 500 and is the first tag nearest to the tag 500 among the first tags.

The second embodiment of the method receives the pre-decompressed data blocks and the tags in the reconfigurable processor, obtains a current tag from the tags, obtains a data block whose tag is the current tag from the pre-decompressed data blocks if the current tag is a first tag, and obtains the data block whose tag is before the current tag and is the first tag nearest to the current tag among the first tags if the current tag is a second tag. Thus, the method can decompress the data without distortion and without a statistical model. Otherwise, the method for decompressing data can be not only used by itself, but also simultaneously combined with other known methods for data decompression, for example, a statistical scheme and a dictionary scheme, thus a speed of decompressing can be improved.

Figure 6:
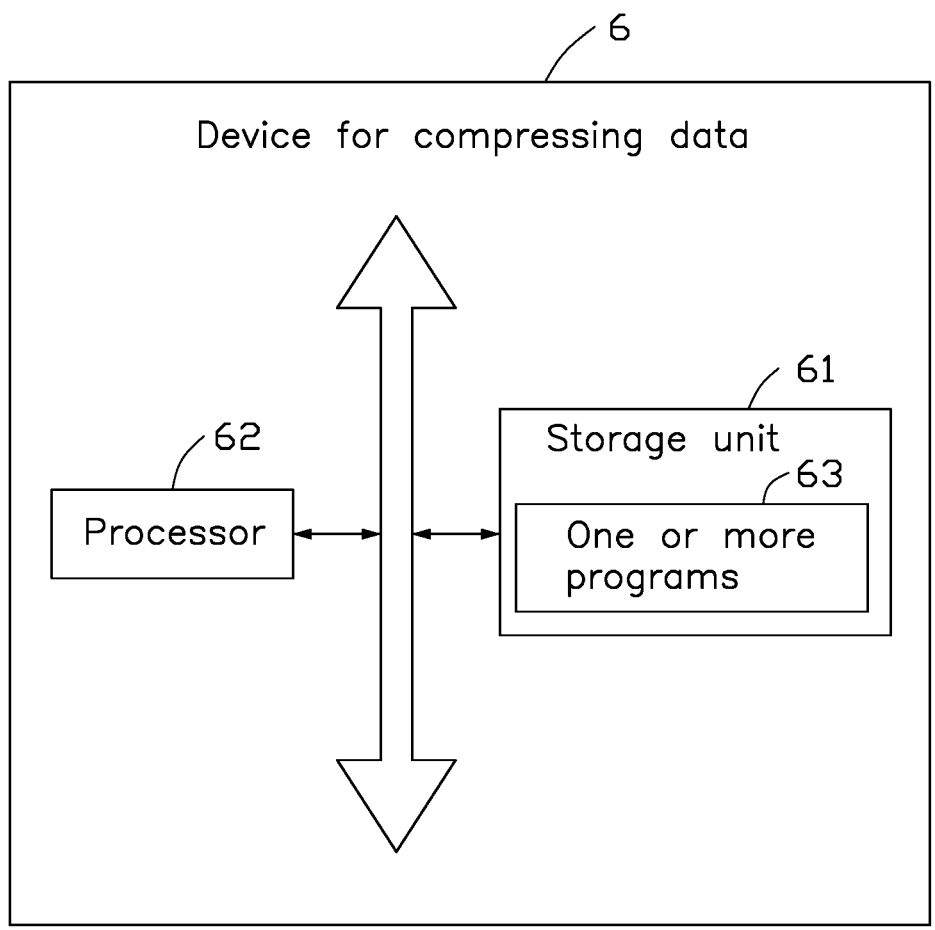
FIG. 6 illustrates a block diagram of a third embodiment of a device for compressing data.

FIG. 6 illustrates a block diagram of a third embodiment of a device for compressing data. The device for compressing data 6 can include a storage unit 61, at least one processor 62, and one or more programs 63 stored in the storage unit 61 and can be run on the at least one processor 62. The at least one processor 62 can execute the one or more programs 63 to accomplish the steps of the exemplary method for compressing data.

The one or more programs 63 can be divided into one or more modules/units. The one or more modules/units can be stored in the storage unit 61 and executed by the at least one processor 62 to accomplish the purpose of the present disclosure. The one or more modules/units can be a series of program command segments which can perform specific functions, and the command segment is configured to describe the execution process of the one or more programs 63 in the device for compressing data 6.

The device for compressing data 6 can be any suitable electronic device, for example, a decoder, a reconfigurable processor, or the like. A person skilled in the art knows that the device for compressing data 6 in FIG. 6 is only an example and is not to be considered as limiting of the device for compressing data 6, the device for compressing data 6 may include more or fewer parts than the diagram, or may combine certain parts, or include different parts.

The at least one processor 62 can be one or more central processing units, or it can be one or more other universal processors, digital signal processors, application-specific integrated circuits, field-programmable gate arrays, or other programmable logic devices, discrete gate or transistor logic, discrete hardware components, and so on. The at least one processor 62 can be a microprocessor or the at least one processor 62 can be any regular processor or the like. The at least one processor 62 can be a control center of the device for compressing data 6, using a variety of interfaces and lines to connect various parts of the entire device for compressing data 6.

The storage unit 61 stores the one or more programs 63 and/or modules/units. The at least one processor 62 can run or execute the one or more programs and/or modules/units stored in the storage unit 61, call out the data stored in the storage unit 61 and accomplish the various functions of the device for compressing data 6. The storage unit 61 may include a program area and a data area. The program area can store an operating system and applications that are required for the at least one function, such as sound playback features, image playback functions, and so on. The data area can store data created according to the use of the device for compressing data 6, such as audio data, and so on. In addition, the storage unit 61 can include a non-transitory storage medium, such as hard disk, memory, plug-in hard disk, smart media card, secure digital, flashcard, at least one disk storage device, flash memory, or another non-transitory storage medium.

If the integrated module/unit of the device for compressing data 6 is implemented in the form of or by means of a software functional unit and is an independent product sold or used, all parts of the integrated module/unit of the device for compressing data 6 may be stored in a non-transitory computer-readable storage medium.

Figure 7:
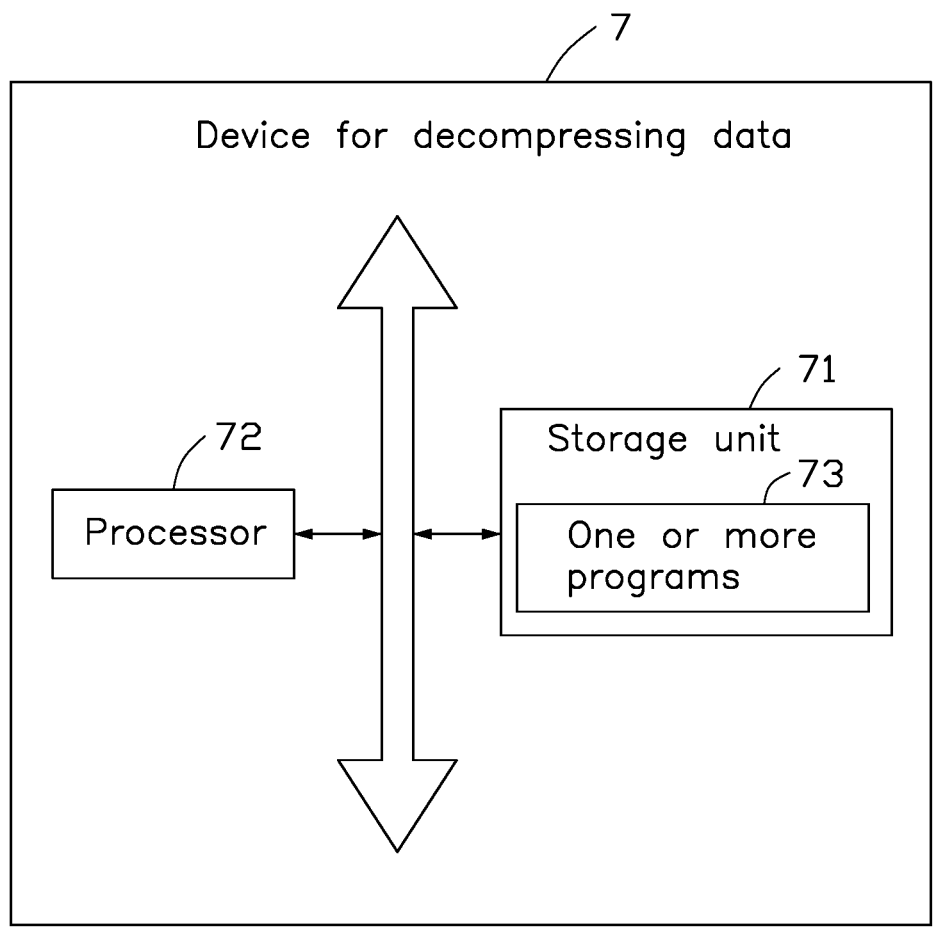
FIG. 7 illustrates a block diagram of a fourth embodiment of a device for decompressing data.

FIG. 7 illustrates a block diagram of a fourth embodiment of a device for decompressing data. The device for decompressing data 7 can include a storage unit 71, at least one processor 72, and one or more programs 73 stored in the storage unit 71 and can be run on the at least one processor 72. The at least one processor 72 can execute the one or more programs 73 to accomplish the steps of the exemplary method for decompressing data.

The one or more programs 73 can be divided into one or more modules/units. The one or more modules/units can be stored in the storage unit 71 and executed by the at least one processor 72 to accomplish the purpose of the present disclosure. The one or more modules/units can be a series of program command segments which can perform specific functions, and the command segment is configured to describe the execution process of the one or more programs 73 in the device for decompressing data 7.

The device for decompressing data 7 can be any suitable electronic device, for example, a decoder, a reconfigurable processor, or the like. A person skilled in the art knows that the device for decompressing data 7 in FIG. 7 is only an example and is not to be considered as limiting of the device for decompressing data 7, the device for decompressing data 7 may include more or fewer parts than the diagram, or may combine certain parts, or include different parts.

The at least one processor 72 can be one or more central processing units, or it can be one or more other universal processors, digital signal processors, application-specific integrated circuits, field-programmable gate arrays, or other programmable logic devices, discrete gate or transistor logic, discrete hardware components, and so on. The at least one processor 72 can be a microprocessor or the at least one processor 72 can be any regular processor or the like. The at least one processor 72 can be a control center of the device for decompressing data 7, using a variety of interfaces and lines to connect various parts of the entire device for decompressing data 7.

The storage unit 71 stores the one or more programs 73 and/or modules/units. The at least one processor 72 can run or execute the one or more programs and/or modules/units stored in the storage unit 71, call out the data stored in the storage unit 71 and accomplish the various functions of the device for decompressing data 7. The storage unit 71 may include a program area and a data area. The program area can store an operating system and applications that are required for the at least one function, such as sound playback features, image playback functions, and so on. The data area can store data created according to the use of the device for decompressing data 7, such as audio data, and so on. In addition, the storage unit 71 can include a non-transitory storage medium, such as hard disk, memory, plug-in hard disk, smart media card, secure digital, flashcard, at least one disk storage device, flash memory, or another non-transitory storage medium.

If the integrated module/unit of the device for decompressing data 7 is implemented in the form of or by means of a software functional unit and is an independent product sold or used, all parts of the integrated module/unit of the device for decompressing data 7 may be stored in a non-transitory computer-readable storage medium.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. A method for compressing data, the data being pre-compressed data used in a reconfigurable processor, the pre-compressed data comprising a plurality of data blocks, the method comprising:
    obtaining a current data block used in the reconfigurable processor;
    calculating a current checking code of the current data block;
    comparing the current checking code with a previous checking code;
    indicating that a tag of the current data block is a first tag if the current checking code and the previous checking code are different;
    indicating that the tag of the current data block is a second tag if the current checking code and the previous checking code are the same;
    saving data block whose tag is the first tag.

2. The method according to claim 1, wherein the method further comprises:
    omitting the data block whose tag is the second tag.

3. The method according to claim 1, wherein the first tag is one and the second tag is zero.

4. The method according to claim 1, wherein the data block is obtained at a predefined data size.

5. The method according to claim 1, wherein the method further comprises:
    presetting that the current checking code and the previous checking code are different if the current checking code is a checking code of the first current data block.

6. The method according to claim 1, wherein:
    indicating the tag of the current data block comprises:
    indicating the tag of the current data block at a sequence of time of obtaining the current data block;
    saving the data block whose tag is the first tag comprises:
    saving the data block whose tag is the first tag at the sequence of time of obtaining the data block.

7. A method for decompressing data, the data being pre-decompressed data used in a reconfigurable processor, the pre-decompressed data comprising a plurality of pre-decompressed data blocks, the method comprising:
    receiving the pre-decompressed data blocks and a plurality of tags in the reconfigurable processor;
    obtaining a current tag from the tags;
    obtaining a data block whose tag is the current tag from the pre-decompressed data blocks if the current tag is a first tag;
    obtaining the data block whose tag is before the current tag and is the first tag nearest to the current tag among the first tags if the current tag is a second tag.

8. The method according to claim 7, wherein obtaining the current tag from the tags comprises:
    obtaining the current tag from the tags one-by-one at a sequence of time of indicating the tag.

9. The method according to claim 7, wherein the first tag is one and the second tag is zero.

10. A device for compressing data, the data being pre-compressed data used in a reconfigurable processor, the pre-compressed data comprising a plurality of data blocks, the device comprising:
    a storage device;
    at least one processor; and
    the storage device storing one or more programs, which when executed by the at least one processor, cause the at least one processor to:
    obtain a current data block used in the reconfigurable processor;
    calculate a current checking code of the current data block;
    compare the current checking code with a previous checking code;
    indicate that a tag of the current data block is a first tag if the current checking code and the previous checking code are different;
    indicate that the tag of the current data block is a second tag if the current checking code and the previous checking code are the same;
    save data block whose tag is the first tag.

11. The device according to claim 10, further causing the at least one processor to:
   omit the data block whose tag is the second tag.

12. The device according to claim 10, wherein the first tag is one and the second tag is zero.

13. The device according to claim 10, wherein the data block is obtained at a predefined data size.

14. The device according to claim 10, further causing the at least one processor to:
   preset that the current checking code and the previous checking code are different if the current checking code is a checking code of the first current data block.

15. The device according to claim 10, further causing the at least one processor to:
   indicate the tag of the current data block at a sequence of time of obtaining the current data block;
   save the data block whose tag is the first tag at the sequence of time of obtaining the data block.

\* \* \* \* \*